United States Patent
Hiraide

(10) Patent No.: US 8,166,380 B2
(45) Date of Patent: Apr. 24, 2012

(54) METHOD AND APPARATUS FOR IDENTIFYING PATHS HAVING APPROPRIATE LENGTHS FOR FAULT SIMULATION

(75) Inventor: Takahisa Hiraide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1623 days.

(21) Appl. No.: 11/521,173

(22) Filed: Sep. 14, 2006

(65) Prior Publication Data
US 2007/0245197 A1 Oct. 18, 2007

(30) Foreign Application Priority Data
Mar. 30, 2006 (JP) ................... 2006-093822

(51) Int. Cl.
G06F 11/00 (2006.01)
G08C 25/00 (2006.01)
H03M 13/00 (2006.01)
H04L 1/00 (2006.01)

(52) U.S. Cl. ........... 714/799; 714/725; 714/741; 702/69

(58) Field of Classification Search .................. 714/725, 714/741, 799; 702/69
See application file for complete search history.

(56) References Cited

U.S. PATENT DOCUMENTS
6,453,437 B1 * 9/2002 Kapur et al. .................. 714/741
7,246,285 B1 * 7/2007 Eldin et al. .................... 714/725

FOREIGN PATENT DOCUMENTS
JP 2004-150820 5/2004

* cited by examiner

Primary Examiner — Sam Rizk
(74) Attorney, Agent, or Firm — Greer, Burns & Crain, Ltd.

(57) ABSTRACT

A fault analysis apparatus includes: an extracting unit that extracts a segment including a point of fault from a plurality of paths in a target circuit; a detecting unit that detects a candidate path that extends, via the segment, from an upstream circuit element to a downstream circuit element; a judging unit that judges whether length of the candidate path is longer than a predetermined length; and a determining unit that determines whether to determine the candidate path as a target path to be subjected to a fault simulation based on a result of judgment.

14 Claims, 11 Drawing Sheets

| | FAULT NUMBER | NAME OF SIGNAL LINE | FAULT TYPE (UP/DN) | DETECTION FLAG (UNDETECTED/ DETECTED) |
|---|---|---|---|---|
| 310-1 | 1 | a | UP | UNDETECTED |
| 310-2 | 2 | a | DN | UNDETECTED |
| 310-3 | 3 | b | UP | UNDETECTED |
| 310-4 | 4 | b | DN | UNDETECTED |
| 310-5 | 5 | c | UP | UNDETECTED |
| 310-6 | 6 | c | DN | UNDETECTED |
| 310-7 | 7 | d | UP | UNDETECTED |
| 310-8 | 8 | d | DN | UNDETECTED |
| 310-9 | 9 | e | UP | UNDETECTED |
| 310-10 | 10 | e | DN | UNDETECTED |
| 300-11 | 11 | f | UP | UNDETECTED |
| 300-12 | 12 | f | DN | UNDETECTED |

| FAULT NUMBER | NAME OF SIGNAL LINE | FAULT TYPE (UP/DN) | DETECTION FLAG (UNDETECTED/ DETECTED) |
|---|---|---|---|
| 1 | a | UP | UNDETECTED |
| 2 | a | DN | UNDETECTED |
| 3 | b | UP | DETECTED |
| 4 | b | DN | UNDETECTED |
| 5 | c | UP | DETECTED |
| 6 | c | DN | UNDETECTED |
| 7 | d | UP | UNDETECTED |
| 8 | d | DN | UNDETECTED |
| 9 | e | UP | UNDETECTED |
| 10 | e | DN | UNDETECTED |
| 11 | f | UP | DETECTED |
| 12 | f | DN | UNDETECTED |

METHOD AND APPARATUS FOR IDENTIFYING PATHS HAVING APPROPRIATE LENGTHS FOR FAULT SIMULATION

CROSS-REFERENCE TO RELATED APPLICATIONS

This application is based upon and claims the benefit of priority from the prior Japanese Patent Application No. 2006-093822, filed on Mar. 30, 2006, the entire contents of which are incorporated herein by reference.

BACKGROUND OF THE INVENTION

1. Field of the Invention

The present invention relates to a fault analysis technology for a semiconductor integrated circuit (IC). More specifically, the present invention relates to a technique for identifying, from among a large number of paths in the semiconductor IC, path having appropriate lengths for a fault simulation.

2. Description of the Related Art

A high-speed, high-performance, and high-density system LSI, which has been developed along with the recent progress in the semiconductor process technology, is likely to suffer from small-delay faults. Accordingly, detection technology for such a delay fault is strongly needed.

In a delay fault, a signal transition occurs but the timing thereof is delayed. Two delay tests for the detection of delay fault have been proposed. The first is a path-delay-fault test in which all the paths in a semiconductor IC are tested. The second is a transition test in which test patterns for paths that are easy to activate are generated on the assumption that there is a serious delay fault in the signal transition on a specific signal line.

On the other hand, a test-pattern generation technique, such as Japanese Patent Laid-Open No. 2004-150820, has been suggested in which a test vector for a specific area of the semiconductor IC is generated.

However, according to the conventional technology disclosed in Japanese Patent Laid-Open No. 2004-150820, the test vector is generated for a path on which static timing analysis (STA) has been executed using circuit data of the semiconductor IC. In STA, only top few hundreds of long paths (critical paths) that affect the speed of the semiconductor IC are tested. As a result, it is difficult to detect all of the delay faults that might occur at any location in the semiconductor IC, which resulting in a poor reliability of the semiconductor IC.

On the other hand, it takes an extremely long time to detect delay faults for all of the paths in the semiconductor IC, which resulting in a longer production time of the semiconductor IC.

SUMMARY OF THE INVENTION

It is an object of the present invention to at least solve the problems in the conventional technology.

A computer-readable recording medium according to an aspect of the present invention stores therein a fault-analysis program. The fault-analysis program causes a computer to execute: extracting a segment including a point of fault from a plurality of paths in a target circuit; detecting a candidate path that extends, via the segment, from a circuit element that is located upstream of the segment to a circuit element that is located downstream of the segment; judging whether length of the candidate path is longer than a predetermined length; and determining whether to determine the candidate path as a target path to be subjected to a fault simulation based on a result of the judging.

A fault analysis method according to another aspect of the present invention includes: extracting a segment including a point of fault from a plurality of paths in a target circuit; detecting a candidate path that extends, via the segment, from a circuit element that is located upstream of the segment to a circuit element that is located downstream of the segment; judging whether length of the candidate path is longer than a predetermined length; and determining whether to determine the candidate path as a target path to be subjected to a fault simulation based on a result of the judging.

A fault analysis apparatus according to still another aspect of the present invention includes: an extracting unit that extracts a segment including a point of fault from a plurality of paths in a target circuit; a detecting unit that detects a candidate path that extends, via the segment, from a circuit element that is located upstream of the segment to a circuit element that is located downstream of the segment; a judging unit that judges whether length of the candidate path is longer than a predetermined length; and a determining unit that determines whether to determine the candidate path as a target path to be subjected to a fault simulation based on a result of judgment by the judging unit.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3B is a diagram of a fault list;

FIG. 9 is a diagram of a fault list;

DETAILED DESCRIPTION OF THE PREFERRED EMBODIMENTS

Exemplary embodiments of the present invention will be explained in detail with reference to the accompanying drawings.

Figure 1:
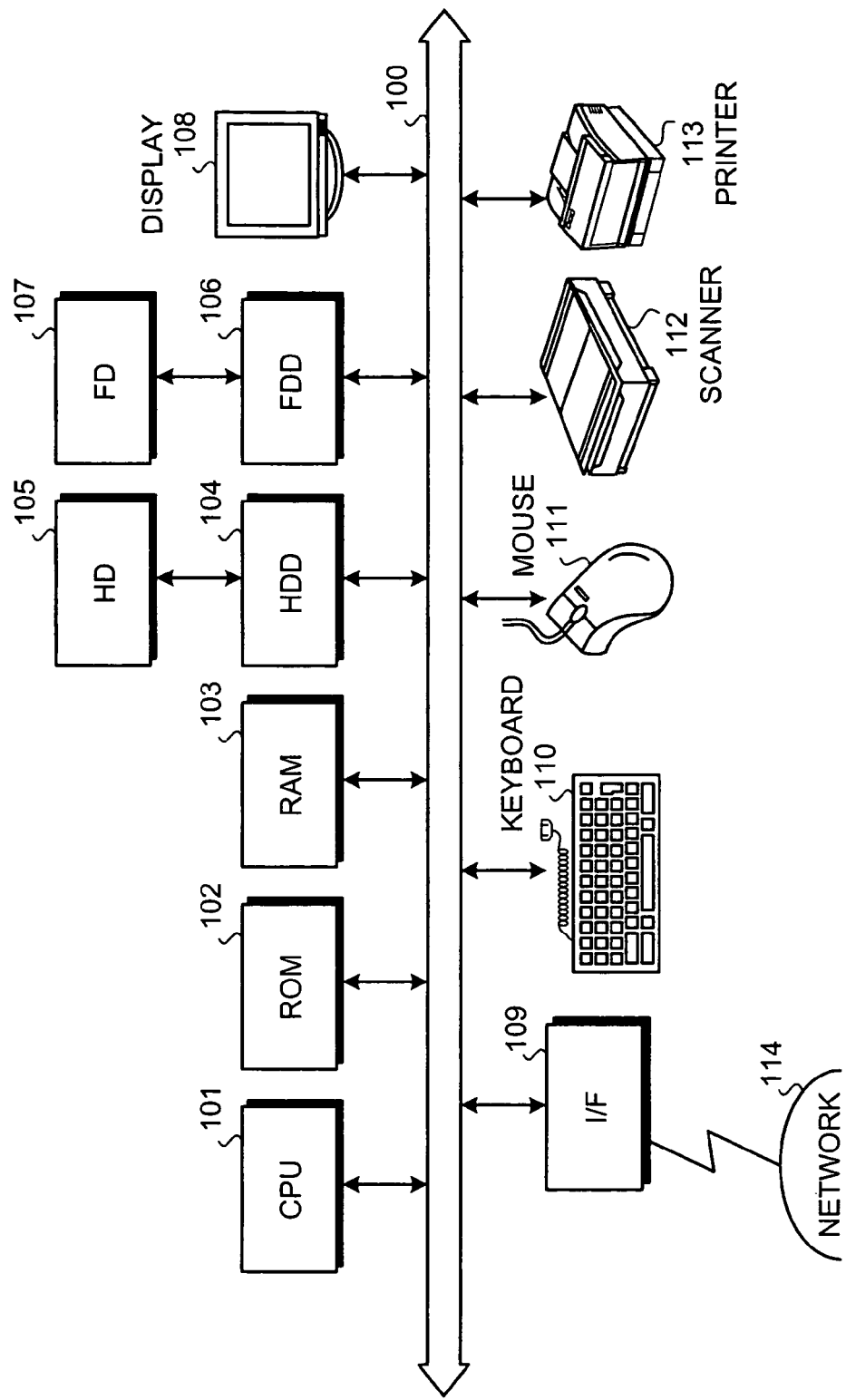
FIG. 1 is a diagram for explaining hardware configuration of a fault analysis apparatus according to an embodiment of the present invention.

FIG. 1 is a diagram for explaining hardware configuration of a fault analysis apparatus according to an embodiment of the present invention. The fault analysis apparatus includes a central processing unit (CPU) 101, a read only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. The above units are connected via a bus 100.

The CPU 101 controls the entire fault analysis apparatus. The ROM 102 stores a program such as a boot program. The RAM 103 is used as a work area of the CPU 101. The HDD 104 controls reading/writing of data from/to the HD 105 under the control of the CPU 101. The HD 105 stores data that is written into the HD 105 under the control of the HDD 104.

The FDD 106 controls reading/writing of data from/to the FD 107 under the control of the CPU 101. The FD 107 stores data that is written into the FD 107 under the control of the FDD 106, and causes the fault analysis apparatus to read data in the FD 107.

A compact-disc read-only memory (CD-ROM) (or compact-disc recordable (CD-R), compact-disc rewritable (CD-RW), etc.), a magneto optical (MO) disc, a digital versatile disc (DVD), and a memory card may be used as a removable recording medium besides the FD 107. The display 108 displays not only a cursor, an icon, and a tool box, but also data such as documents, images, information of functions, etc. For example, a cathode-ray tube (CRT), a thin-film transistor (TFT) display, a plasma display can be employed as the display 108.

The I/F 109 is connected to a network 114 such as the Internet via communication lines, and connected to other devices via the communication lines. The I/F 109 is an interface between the network 114 and the fault analysis apparatus, and controls input/output from/to external devices. For example, a modem and a local area network (LAN) adapter can be employed as the I/F 109.

The keyboard 110 includes plural keys to input characters, numbers, various instructions, etc. An input pad having a touch panel and a numeric key pad can be employed as the keyboard 110. The mouse 111 is for moving a cursor, selecting key range, moving a window, changing the size of a window, etc. Such a trackball and a joystick that has a similar function to a function of a pointing device may be employed instead of the mouse 111.

The scanner 112 optically reads an image and inputs image data into the fault analysis apparatus. The scanner 112 may have a function of optical character recognition (OCR). The printer 113 prints out image data and document data. For example, a laser printer and an ink-jet printer can be employed as the printer 113.

Figure 2:
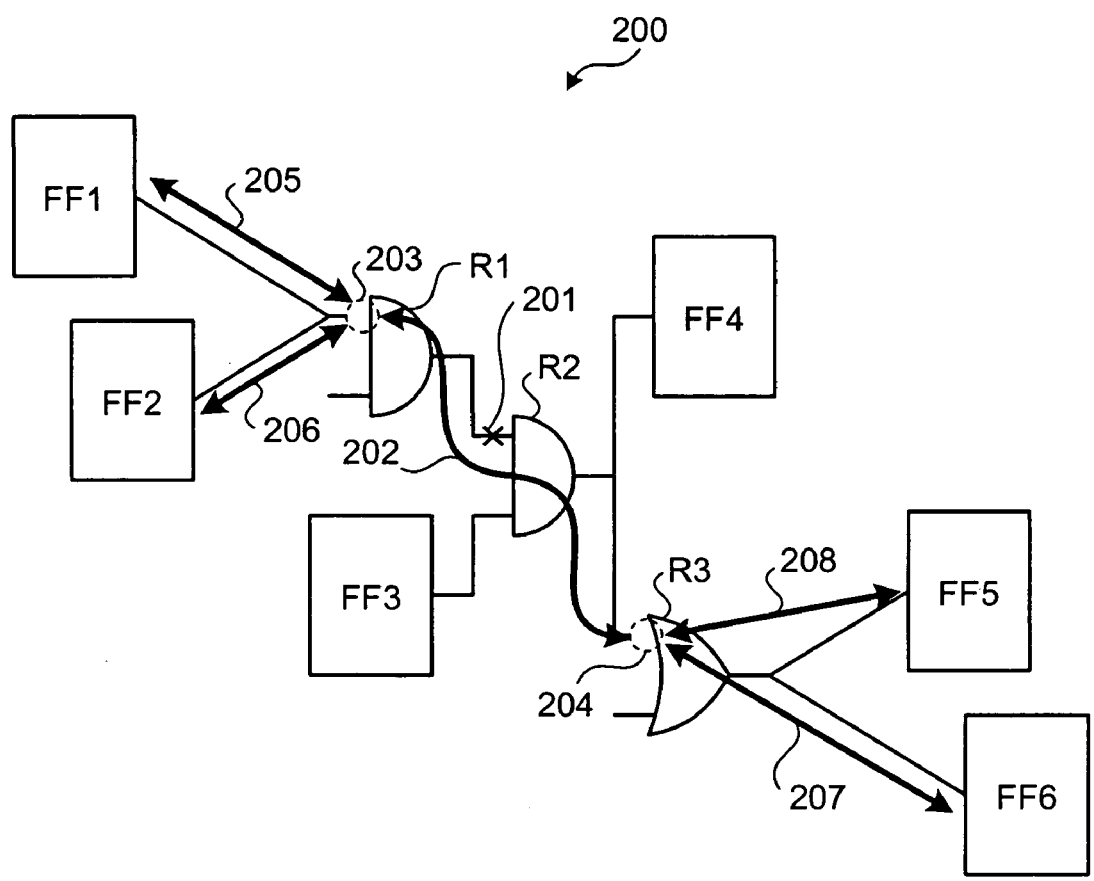
FIG. 2 is a diagram for explaining a relation between a segment and a path.

FIG. 2 is a diagram for explaining a relation between a segment and a path. A circuit 200 includes flip-flop circuits FF1 to FF6 and logic elements R1 to R3. A reference numeral 201 indicates a fault point. A segment 202 indicates a partial path that includes the fault point 201, or the fault point 201 itself. A reference numeral 203 indicates a startpoint of the segment 202. A reference numeral 204 indicates an endpoint of the segment 202.

Hereinafter, "Ti-max" and "Ti-min" represent lengths of a longest path 205 and a shortest path 206, respectively, among the paths extending upstream from the startpoint 203 of the segment 202. "To-max" and "To-min" represent lengths of a longest path 207 and a shortest path 208, respectively, among paths extending downstream from the endpoint 204 of the segment 202. "Tseg" represents the length of the segment 202.

"Max path" and "min path" indicate a longest path (Ti-max+Tseg+To-max) and a shortest path (Ti-min+Tseg+To-min), respectively, among paths including the segment 202. In the example shown in FIG. 2, the max path is a path including the path 205, the segment 202, and the path 207. The min path is a path including the path 206, the segment 202, and the path 208.

Figure 3A:
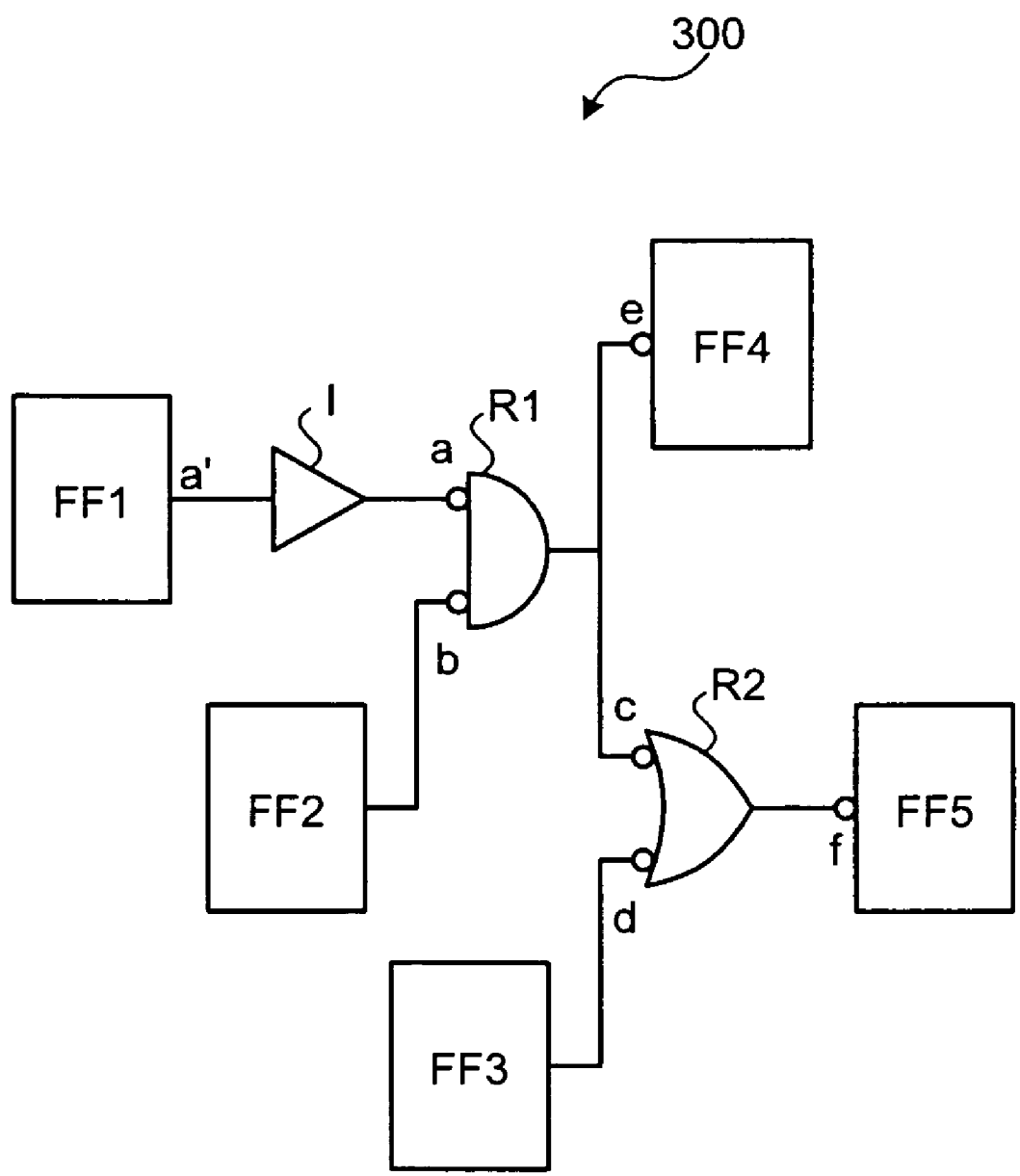
FIG. 3A is a diagram of a target circuit.

FIG. 3A is a diagram of a target circuit. A target circuit 300 includes flip-flop circuits FF1 to FF5, an inverter I, and logic elements R1 and R2.

FIG. 3B is a diagram of a fault list associated with the target circuit 300. A fault list 310 stores fault data 310-1 to 310-12 each of which includes fault number, name of signal line in the target circuit 300 shown in FIG. 3A, fault type, and detection flag. For example, the fault data 310-5 includes fault number "5", name of the signal line "c", fault type "UP", and detection flag "UNDETECTED".

Herein, a fault means a delay fault in which the timing of the transition of a signal is delayed. The fault list 310 is created on the assumption that there are two types of delay faults in the target circuit 300. More specifically, "UP" indicates a delay fault in the signal transition from "0" to "1", and "DN" indicates a delay fault in the signal transition from "1" to "0".

Although it is assumed in the fault list 310 that a delay fault occurs at an input pin, it may be assumed that a delay fault occurs at an output pin. The fault list 310 can be stored in such recording media as the ROM 102, the RAM 103, the HD 105, etc. shown in FIG. 1.

Figure 4:
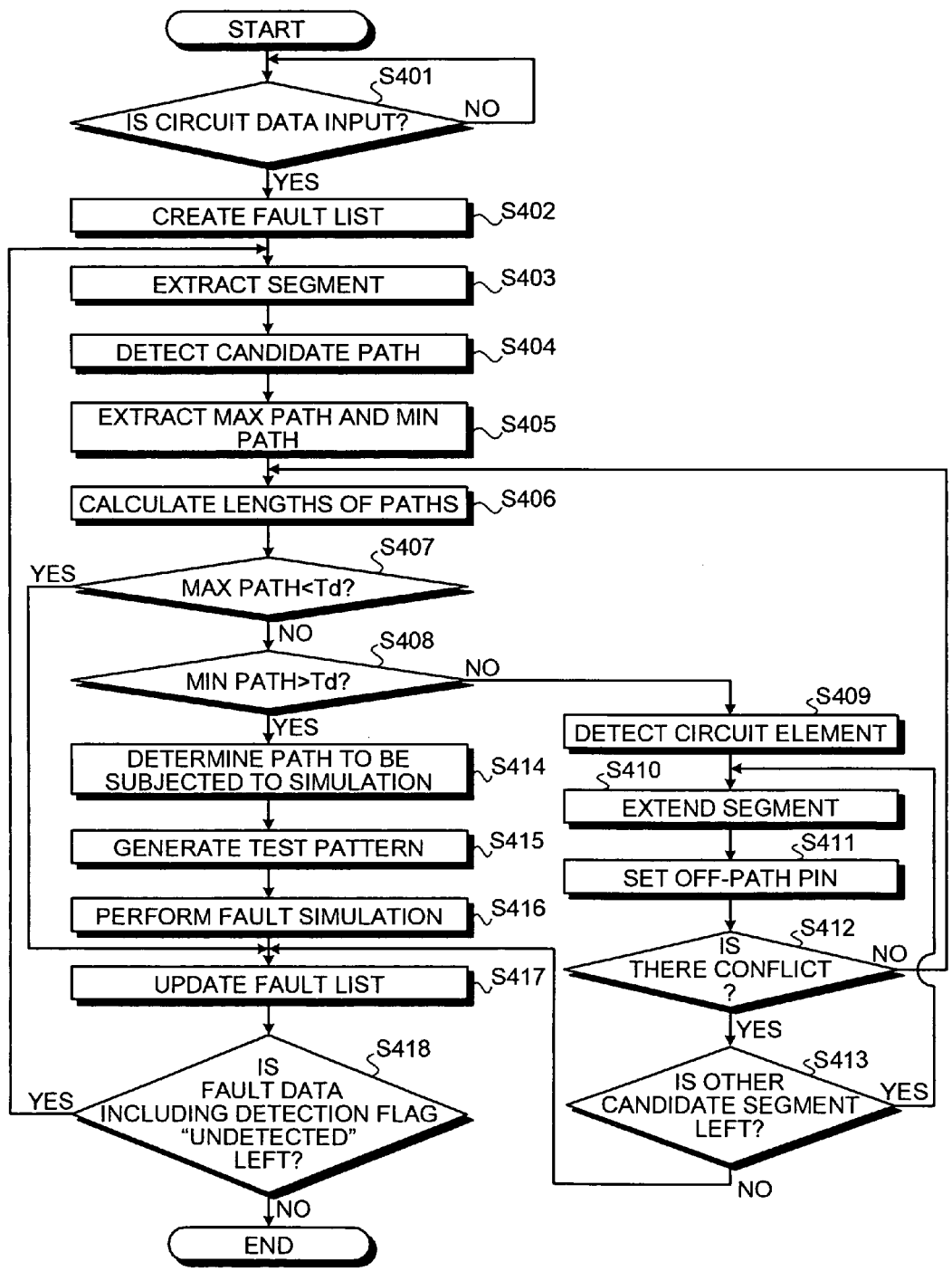
FIG. 4 is a flowchart of processing performed by the fault analysis apparatus.

FIG. 4 is a flowchart of processing performed by the fault analysis apparatus according to an embodiment of the present invention. The delay analysis apparatus determines whether circuit data is input (Step S401). The circuit data indicate the connections of circuit elements in the target circuit 300. For example, as the circuit data, a net list obtained by logic synthesis of register transfer level (RTL) described in hardware description language (HDL) can be used.

When the circuit data is input (Step S401: YES), the fault analysis apparatus creates the fault list 310 shown in FIG. 3B (Step S402) and selects, for example, a piece of fault data including the detection flag "UNDETECTED" from the fault list 310. Then, the fault analysis apparatus extracts a segment that includes a fault point corresponding to the selected fault data (Step S403).

Then, the fault analysis apparatus detects candidate paths each of which extends from an upstream circuit element that is located upstream of the extracted segment to a downstream circuit element that is located downstream of the extracted segment (Step S404). The upstream circuit element is, for example, the FF1, the FF2, or the R1 shown in FIG. 2. The downstream circuit element is, for example, the R3, the FF5, or the FF6 shown in FIG. 2.

Then, the fault analysis apparatus extracts the max path and the min path (Step S406) to calculate the lengths thereof (Step S406), and determines whether the length of the max path is shorter than a reference length Td that is set by a user and used as a threshold for the extension of the segment (Step S407).

When the length of the max path is not shorter than the reference length Td (Step S407: NO), the fault analysis apparatus determines whether the length of the min path is longer than the reference length Td (Step S408). When the length of the min path is not longer than the reference length Td (in other words, when min path≦Td≦max path) (Step S408: NO), the fault analysis apparatus detects a circuit element that is located upstream or downstream of the segment (Step S409), and extends the segment to the detected circuit element (Step S410). The extension of the segment will be explained later with reference to FIGS. 5A and 5B.

Then, the fault analysis apparatus sets off-path pin(s) (Step S411). "On-path pin" is an input pin through which a signal transition is transmitted, while "off-path pin" is an input pin other than the on-path pin. The off-path pins should be set according to setting condition of off-path pin so that a signal transition at an on-path pin is transmitted to a logic element located downstream of the on-path pin. The setting of off-path pin will be explained later with reference to FIG. 6.

After the setting of off-path pin, the fault analysis apparatus determines whether there is any conflict in the setting (Step S412) by performing automatic test pattern generation (ATPG). For example, the fault analysis apparatus determines a predetermined input value and a predetermined output value of each logic element, and input the predetermined input value to the logic element. When an output value from the logic element is equal to the predetermined output value, the fault analysis apparatus determines that there is no conflict in the setting.

When it is determined that there is not any conflict in the setting (Step S412: NO), the fault analysis apparatus calculates the lengths of paths (Step S406). On the other hand, when it is determined that there is any conflict in the setting (Step S412: YES), the fault analysis apparatus determines whether other candidate segment is left (Step S413). When a candidate segment is left (Step S413: YES), the fault analysis apparatus extends the candidate segment (Step S410). On the other hand, when no candidate segment is left (Step S413: NO), the fault analysis apparatus updates the fault list (Step S417).

On the other hand, when the length of the min path is longer than the reference length Td (Step S408: YES), the fault analysis apparatus determines the extracted segment to be subjected to a fault simulation (Step S414), and generates a test pattern by ATPG (Step S415). Then, the fault analysis apparatus inputs the test pattern into the target circuit 300 to perform the fault simulation (Step S416), and updates the fault list based on the result of the simulation (Step S417). For example, the fault analysis apparatus changes the detection flag in the fault list 310 from "UNDETECTED" to "DETECTED", or deletes fault data for which a fault is detected. The update of the fault list will be explained later with reference to FIG. 9.

After the update of the fault list (Step S417), the fault analysis apparatus determines whether fault data including the detection flag "UNDETECTED" is left in the fault list 310 (Step S418). When such fault data is left in the fault list 310 (Step S418: YES), the fault analysis apparatus extracts a segment (Step S403). On the other hand, when such fault data is not left in the fault list 310 (Step S418: NO), a series of the processing is ended there.

On the other hand, when the length of the max path is shorter than the reference length Td (Step S407: YES), the fault analysis apparatus updates the fault list 310 (for example, deletes the fault data from the fault list 310) (Step S417).

In the above explanation, it is assumed that the reference length Td takes only one value. However, with only one value of Td, the fault analysis apparatus may be unable to create all test patterns for detecting all faults because in a semiconductor IC, a fault may occur in various paths for which the lengths of the min path and the max path take various values.

Therefore, it is effective to set various values to Td and to create test patterns corresponding to each value of Td. For example, the fault analysis apparatus sets a value of Td in a descending order, and ignores a fault detected once when generating a test pattern with a different value of Td. Thus, it is possible to activate a path by using a proper value of Td for each fault.

Figure 5A:
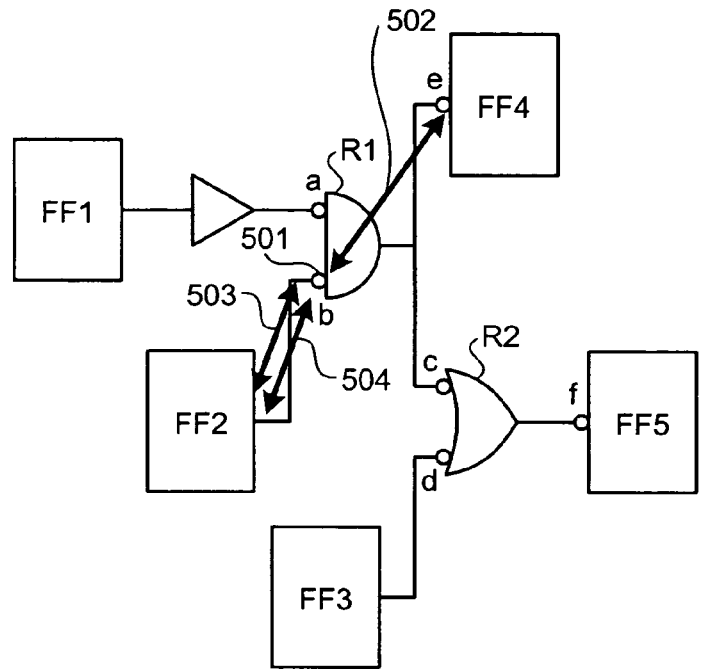
FIGS. 5A and 5B are diagrams for explaining an extension of a segment.
Figure 5B:
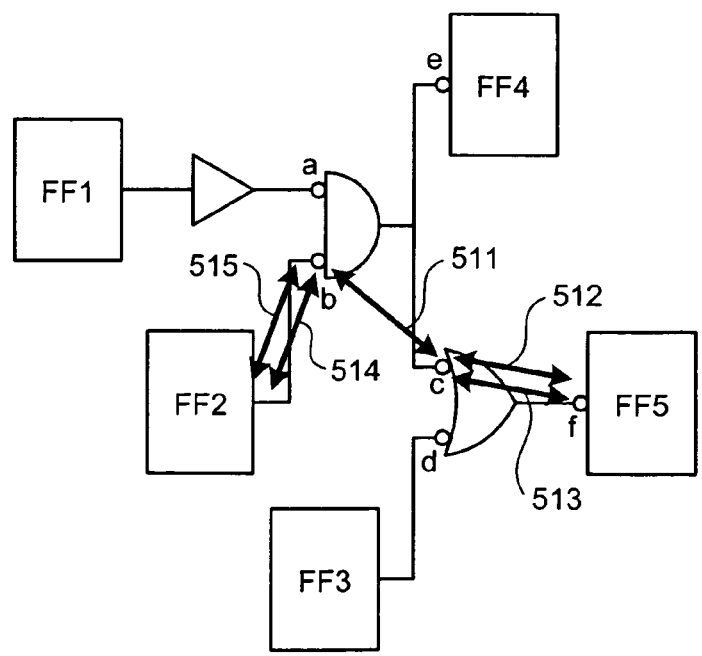

FIGS. 5A and 5B are diagrams for explaining the extension of the segment when the fault data 310-3 including the fault number "3" is selected. A reference numeral 501 indicates a fault point. A reference numeral 502 indicates an extended segment extended downstream to the FF4 (toward the output gate of the logic element R1). Reference numerals 503 and 504 respectively indicate Ti-min and Ti-max (in this case, Ti-min=Ti-max).

It is assumed that the length of a path from the input pin to the output pin of the logic element R1 is 1, the length of each line is also 1, and the reference length Td is 4. In this case, the length of the min path is 3 (=Ti-min(1)+Tseg(2)+To-min(0)). Note that To-min and To-max are both 0 because there is no path in the downstream of the FF4.

A segment 511 shown in FIG. 5B is another example of an extended segment extended to the input pin of the logic element R2. Reference numerals 512 and 513 respectively indicate To-min and To-max. Reference numerals 514 and 515 respectively indicate Ti-min and Ti-max.

The segment may be extended towards the longest path among paths on the input side or the output side of a logic element. The segment may be extended towards a path including the most number of fault points among the paths.

Figure 6:
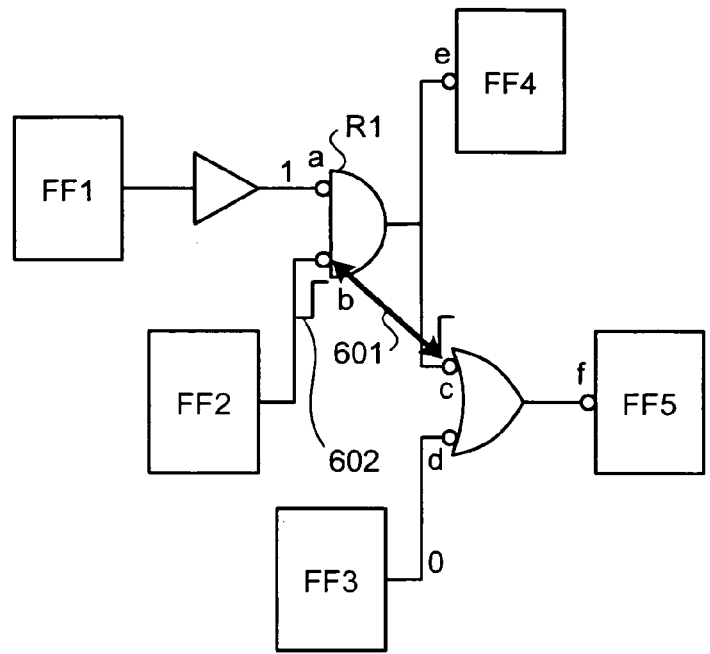
FIG. 6 is a diagram for explaining a setting of off-path pin.

FIG. 6 is a diagram for explaining the setting of off-path pin when the fault data 310-3 including the fault number 3 and the fault type "UP" is selected. A reference numeral 601 indicates an extended segment.

The element R1 is an AND circuit. When a fault type "UP" 602 is set at the signal line "b" (an assumed fault point), the signal line "a" is set to "1" and the signal line "d" is set to "0" according to the setting condition so that the fault type "UP" is transmitted to the on-path pin.

Figure 7:
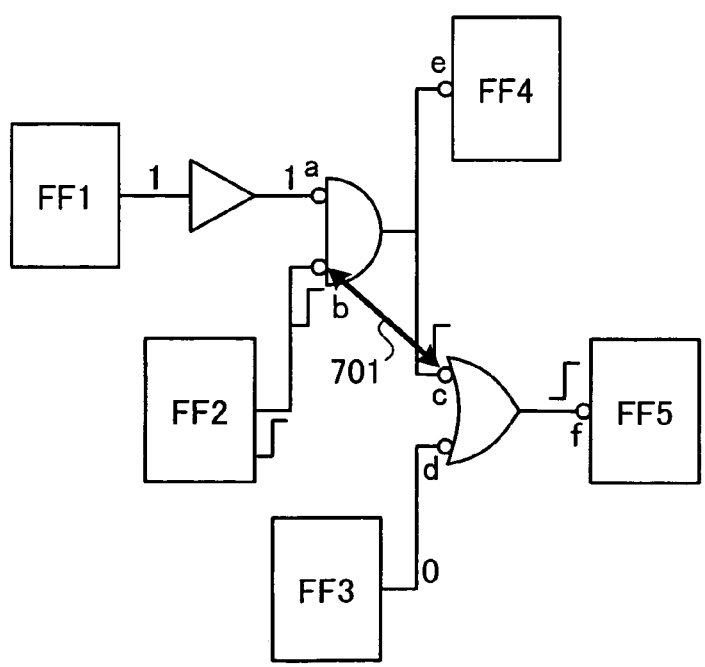
FIG. 7 is a diagram for explaining automatic test pattern generation (ATPG) executed for the target circuit shown in FIG. 6.

FIG. 7 is a diagram for explaining ATPG executed for the target circuit shown in FIG. 6. A reference numeral 701 indicates a segment. The input from the FF2 is "UP" because the fault type of the selected fault data 310-3 is "UP". The inputs from the FF1 and the FF3 are "1" and "0", respectively, because the signal lines "a" and "d" are set to "1" and "0", respectively, as shown in FIG. 6 according to the setting condition for transmitting the fault type "UP". Thus, the input to the FF5 is determined to be "up".

In the above explanation, it is assumed that an interval of a test clock of a test pattern is fixed. However, the accuracy of the detection of small delay fault can be improved by changing the interval of the test clock.

FIG. 8 is a diagram for explaining a fault simulation when the fault data 310-3 including the fault number "3" is selected (when the signal line b is the fault point).

Figure 8A:
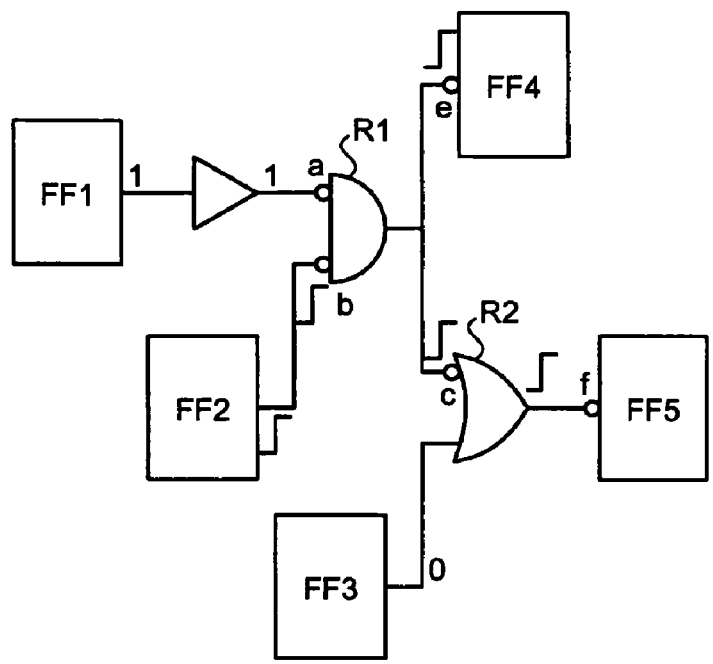
FIGS. 8A and 8B are diagrams for explaining a fault simulation.

A simulation is performed on condition that the input from the FF1 is "1" and the input from the FF2 is "UP" as shown in FIG. 8A. The input to the signal line "a" of the logic element R1 becomes "1", the input to the signal line "b" becomes "UP", and therefore the input to the FF4 is determined to be "UP".

Figure 8B:
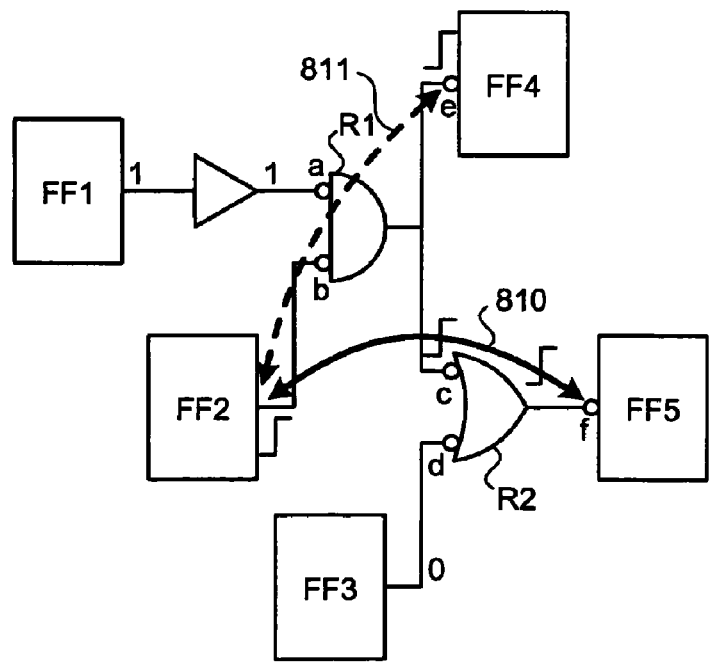

The fault analysis apparatus calculates the lengths of paths indicated by a full line 810 and a dotted line 811 in FIG. 8B, on which a signal is changing. In other words, the fault analysis apparatus calculates the lengths of the paths through which a signal of "UP" or "DN" is transmitted.

When a segment (not shown) is extended to the FF5, the min path includes the signal line b, the logic element R1, the signal line c, the logic element R2, and the signal line f. Because the length of the min path (5) is longer than Td (4), delay faults corresponding to the fault number "3", "5", and "11" are detected based on the full line 810.

When a segment is extended to the FF4, the min path includes the signal line b, the logic element R1, and the signal line e. Because the length of the max path (3) is shorter than Td (4), the candidate paths are determined to be redundant paths and no fault corresponding to the fault number "9" is detected.

FIG. 9 is a diagram of the fault list in which some of the detection flags are updated. More specifically, the detection flags corresponding to the fault number "3", "5", and "11" are updated from "UNDETECTED" to "DETECTED".

As explained above, when the reference length Td takes various values, the interval of the test clock may be optimally adjusted to detect a delay fault for each value of Td. The generation of the test pattern when the interval of the test clock is optimally adjusted is similar to the generation shown in the flowchart of FIG. 4, but an activation condition of a path is different.

This is because the hazard on a reconvergent path, in which a path diverges into plural paths and converges into one path again, prevents the fault detection. The hazard means a pulse that is not generated at the output gate logically, but is generated due to a delay.

Figure 10:
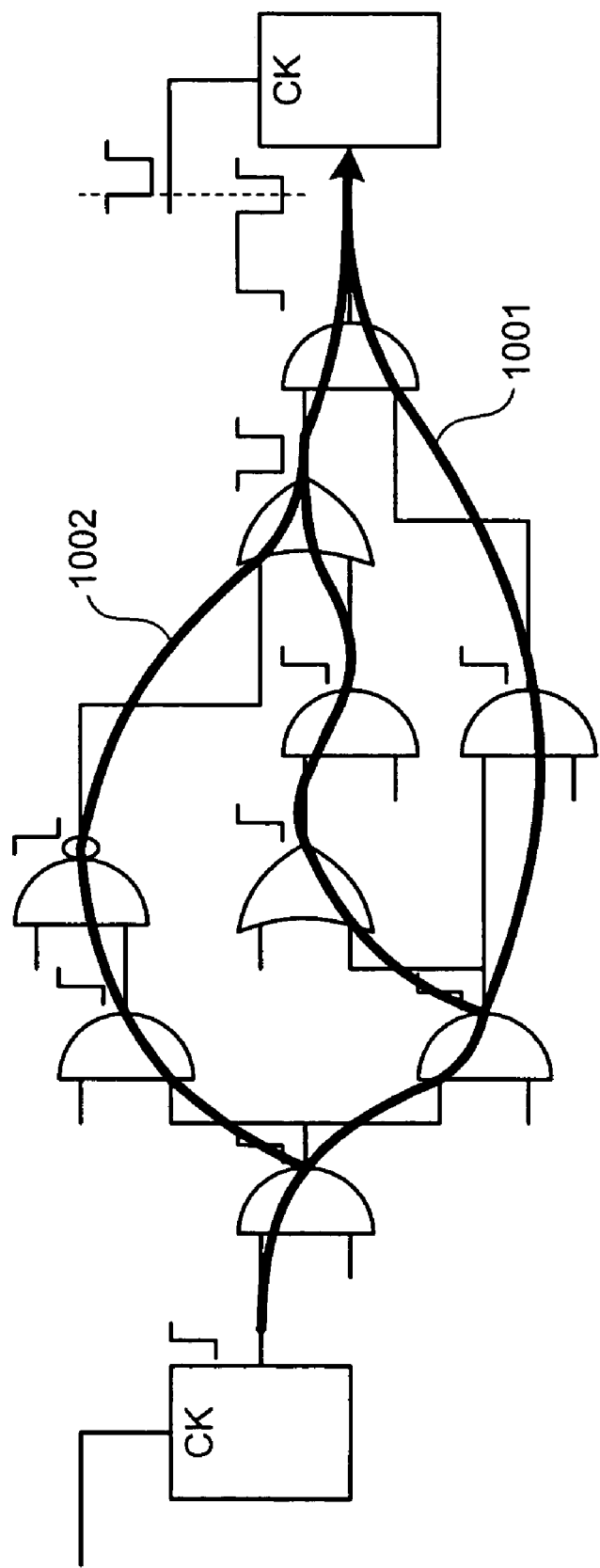
FIG. 10 is a diagram for explaining an effect of a hazard that occurs in a reconvergent circuit.

FIG. 10 is a diagram for explaining the effect of the hazard that occurs in the reconvergent circuit. A reference numeral 1001 indicates a reconvergent path. A reference numeral 1002 indicates an active path. Even when the length of the active path 1002 is shorter than Td, a delay fault might not be detected due to the effect of the hazard if the length of the reconvergent path is longer than Td.

In this case, in the activation check of a segment and the activation of a path by ATPG, the off-path pins are set with signal values that do not include hazard so that only the path satisfying the condition is subjected to a simulation in which the interval of the test clock is changed. Thus, it becomes possible to perform a fault simulation for a small delay fault even when the max path cannot be activated.

Figure 11:
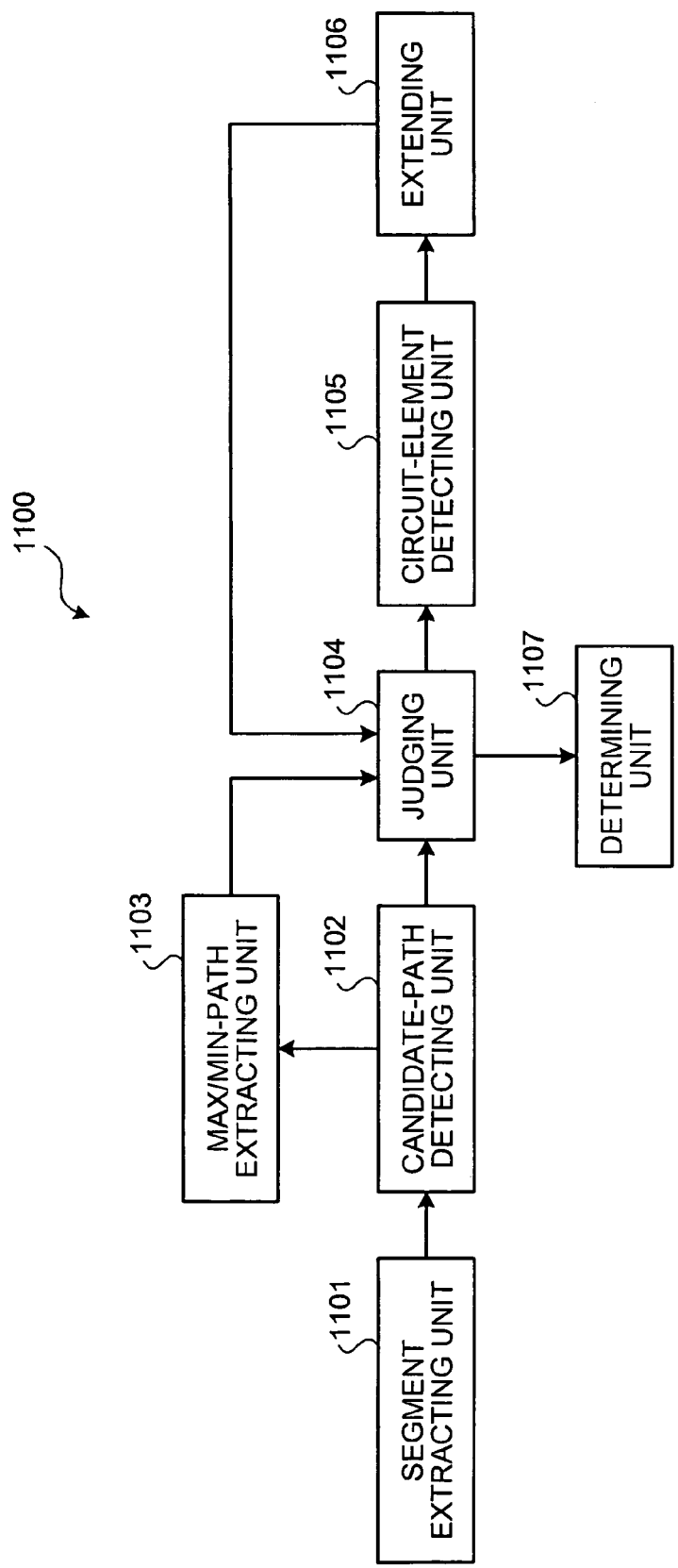
FIG. 11 is a diagram for explaining functional configuration of the fault analysis apparatus.

FIG. 11 is a diagram for explaining functional configuration of the fault analysis apparatus. A fault analysis apparatus 1100 includes a segment extracting unit 1101, a candidate-path detecting unit 1102, a max/min-path extracting unit 1103, a judging unit 1104, a circuit-element detecting unit 1105, an extending unit 1106, and a determining unit 1107.

The segment extracting unit 1101 extracts, from plural paths in the target circuit, a segment that includes a fault point. In other words, the segment extracting unit 1101 performs the extraction of the segment at Step S403 shown in FIG. 4.

The candidate-path detecting unit 1102 detects plural paths each of which extends from the upstream circuit element to the downstream circuit element via the segment. In other words, the candidate-path detecting unit 1102 performs the detection of candidate paths at Step S404 shown in FIG. 4.

The max/min-path extracting unit 1103 extracts the longest or the shortest path from among the candidate paths. In other words, the max/min-path extracting unit 1103 performs the extraction of the max path and the min path at Step S405 shown in FIG. 4.

The judging unit 1104 judges whether the length of the max/min path extracted by the max/min-path extracting unit 1103 is shorter/longer than a predetermined length. In other words, the judging unit 1104 judges whether the max/min path is shorter/longer than the reference length Td at Steps S407 and S408 shown in FIG. 4.

The circuit-element detecting unit 1105 detects an arbitrary circuit element from circuit elements that are located upstream or downstream of the segment, when it is judged that the length of the min path≦the reference length Td≦the length of the max path. In other words, the circuit-element detecting unit 1105 performs the detection of circuit element at Step S409 shown in FIG. 4.

The extending unit 1106 extends the segment extracted by the segment extracting unit 1101 to the circuit element detected by the circuit-element detecting unit 1105. In other words, the extending unit 1106 performs the extension of segment at Step S410 shown in FIG. 4.

The determining unit 1107 determines candidate paths to be subjected to a fault simulation based on a result of the judgment performed by the judging unit 1104. In other words, the determining unit 1107 determines paths to be subjected to the simulation at Step S414 shown in FIG. 4.

The segment extracting unit 1101, the candidate-path detecting unit 1102, the max/min-path extracting unit 1103, the judging unit 1104, the circuit-element detecting unit 1105, the extending unit 1106, and the determining unit 1107 can be realized by the CPU 101 that executes a program stored in such memory media as ROM 102, RAM 103, HD 105, and FD 107 shown in FIG. 1.

According to the present invention as explained above, a proper length of a path to detect a small delay fault in the target circuit can be obtained. Furthermore, enough length of a path to detect a small delay fault in the target circuit can be obtained. Therefore, it becomes possible to precisely detect a delay fault.

Furthermore, the length of the minimum path can be longer than the reference length. Therefore, it becomes possible to precisely detect a delay fault, to shorten a period for the fault analysis, and to decrease the number of test patterns for the fault simulation.

According to the method and apparatus for fault analysis and the computer product according to the present invention as explained above, the reliability of the semiconductor IC can be improved and the production time thereof can be shortened.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A non-transitory computer-readable recording medium that stores therein a fault-analysis program that causes a computer to execute:

extracting a segment including a point of fault from a plurality of paths in a target circuit;

extending the segment to a circuit element that is located upstream of the segment and to a circuit element that is located downstream of the segment where the extended segment is called a candidate path;

comparing length of the candidate path with a predetermined length; and determining whether to determine the candidate path as a target path to be subjected to a fault simulation based on a result of the comparing.

2. The non-transitory computer-readable recording medium according to claim 1, wherein the extending includes generating a plurality of candidate paths;

the comparing includes judging whether the shortest candidate path is longer than the predetermined length; and the determining includes determining, when it is judged that the shortest candidate path is longer than the predetermined length, the candidate paths as target paths to be subjected to the fault simulation.

3. The non-transitory computer-readable recording medium according to claim 2, wherein the fault-analysis program further causes the computer to execute:
   extending the candidate path to a circuit element that is located upstream of the candidate path and to a circuit element that is located downstream of the candidate path if mini-path$\leqq T_d \leqq$max-path where the mini-path denotes the shortest candidate path, $T_d$ denotes the predetermined length, and the max-path denotes the longest candidate path.

4. The non-transitory computer-readable recording medium according to claim 2, wherein
   the comparing includes judging whether the longest candidate path is shorter than the predetermined length; and
   the determining includes determining, when it is judged that the longest candidate path is shorter than the predetermined length, the candidate paths as redundant paths not to be subjected to the fault simulation.

5. The non-transitory computer-readable recording medium according to claim 1, wherein the fault-analysis program further causes the computer to execute setting an off-path pin to find out a conflict in the setting.

6. The non-transitory computer-readable recording medium according to claim 5, wherein the off-path pin is set with values that do not include hazard.

7. A fault analysis method using a programmed computer comprising:
   extracting a segment including a point of fault from a plurality of paths in a target circuit;
   extending the segment, to a circuit element that is located upstream of the segment and to a circuit element that is located downstream of the segment where the extended segment is called a candidate path;
   comparing length of the candidate path with a predetermined length; and
   determining whether to determine the candidate path as a target path to be subjected to a fault simulation based on a result of the comparing.

8. The fault analysis method according to claim 7, wherein
   the extending includes generating a plurality of candidate paths;
   the comparing includes judging whether the shortest candidate path is longer than the predetermined length; and
   the determining includes determining, when it is judged that the shortest candidate path is longer than the predetermined length, the candidate paths as target paths to be subjected to the fault simulation.

9. The fault analysis method according to claim 8 further comprising:
   extending the candidate path to a circuit element that is located upstream of the candidate path and to a circuit element that is located downstream of the candidate path if mini-path$\leqq T_d \leqq$max-path where the mini-path denotes the shortest candidate path, $T_d$ denotes the predetermined length, and the max-path denotes the longest candidate path.

10. The fault analysis method according to claim 7, wherein
    the comparing includes judging whether the longest candidate path is shorter than the predetermined length; and
    the determining includes determining, when it is judged that the longest candidate path is shorter than the predetermined length, the candidate paths as redundant paths not to be subjected to the fault simulation.

11. A fault analysis apparatus comprising:
    an extracting unit that extracts a segment including a point of fault from a plurality of paths in a target circuit;
    a first extending unit that extends the segment, to a circuit element that is located upstream of the segment and to a circuit element that is located downstream of the segment where the extended segment is called a candidate path;
    a comparing unit that compares length of the candidate path with a predetermined length; and
    a determining unit that determines whether to determine the candidate path as a target path to be subjected to a fault simulation based on a result of the comparing unit.

12. The fault analysis apparatus according to claim 11, wherein
    the first extending unit generates a plurality of candidate paths;
    the comparing unit judges whether the shortest candidate path is longer than the predetermined length; and
    the determining unit determines, when it is judged that the shortest candidate path is longer than the predetermined length, the candidate paths as target paths to be subjected to the fault simulation.

13. The fault analysis apparatus according to claim 12 further comprising:
    a second extending unit that extends the candidate path to a circuit element that is located upstream of the candidate path and to a circuit element that is located downstream of the candidate path if mini-path$\leqq T_d \leqq$max-path where the mini-path denotes the shortest candidate path, $T_d$ denotes the predetermined length, and the max-path denotes the longest candidate path.

14. The fault analysis apparatus according to claim 11, wherein
    the comparing unit judges whether the longest candidate path is shorter than the predetermined length; and
    the determining unit determines, when it is judged that the longest candidate path is shorter than the predetermined length, the candidate paths as redundant paths not to be subjected to the fault simulation.

* * * * *